(12) United States Patent
Fukuda et al.

(10) Patent No.: US 6,759,684 B2
(45) Date of Patent: Jul. 6, 2004

(54) SIC SEMICONDUCTOR DEVICE

(75) Inventors: Kenji Fukuda, Tsukuba (JP); Kazuo Arai, Tsukuba (JP); Junji Senzaki, Tsukuba (JP); Shinsuke Harada, Tsukuba (JP); Ryoji Kosugi, Tsukuba (JP); Kazuhiro Adachi, Newcastle upon Tyne (GB)

(73) Assignees: National Institute of Advanced Industrial Science and Technology, Tokyo (JP); Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 09/987,271

(22) Filed: Nov. 14, 2001

(65) Prior Publication Data

US 2002/0047125 A1 Apr. 25, 2002

(30) Foreign Application Priority Data

Nov. 14, 2000 (JP) ........................................ 2000-346455

(51) Int. Cl.[7] ..................... H01L 31/0312; H01L 29/76; H01L 29/94
(52) U.S. Cl. ..................... 257/77; 257/628; 257/341; 257/335
(58) Field of Search ..................... 257/77, 628, 341, 257/335, 348, 349, 402, 404, 407, 336, 627

(56) References Cited

U.S. PATENT DOCUMENTS

| 4,017,888 A | * | 4/1977 | Christie et al. ............... 357/54 |
| 4,714,519 A | * | 12/1987 | Pfiester ......................... 437/81 |
| 5,736,753 A | * | 4/1998 | Ohno et al. .................... 257/77 |
| 5,814,869 A | * | 9/1998 | Dennen ....................... 257/408 |
| 5,864,157 A |   | 1/1999 | Fu |
| 5,952,701 A | * | 9/1999 | Bulucea et al. .............. 257/407 |
| 6,114,728 A | * | 9/2000 | Yamazaki et al. ........... 257/347 |

FOREIGN PATENT DOCUMENTS

| JP | 7-131016 | 5/1995 |
| JP | 6-186179 | 7/1996 |

OTHER PUBLICATIONS

A.R. Smith, et al., "Reconstructions of GaN(0001) and (0001) Surfaces: Ga–rich Metallic Structures," pp. 1–17.

* cited by examiner

*Primary Examiner*—Jerome Jackson
*Assistant Examiner*—Joseph Nguyen
(74) *Attorney, Agent, or Firm*—Oblon, Spivak, McClelland, Maier & Neustadt, P.C.

(57) ABSTRACT

An MIS transistor that uses a silicon carbide substrate has a buried channel structure. The surface orientation of the silicon carbide substrate is optimized so that the device does not assume a normally on state, has good hot-carrier endurance and punch-through endurance, and high channel mobility. In particular, a P-type silicon carbide semiconductor substrate is used to form a buried channel region. To achieve high mobility, the depth at which the buried channel region is formed is optimized, and the ratio between buried channel region junction depth ($L_{bc}$) source and drain region junction depth ($X_j$) is made to be within 0.2 to 1.0. The device can be formed on any surface of a hexagonal or rhombohedral or a (110) surface of a cubic system silicon carbide crystal, and provides a particularly good effect when formed on the (11–20) surface.

34 Claims, 7 Drawing Sheets

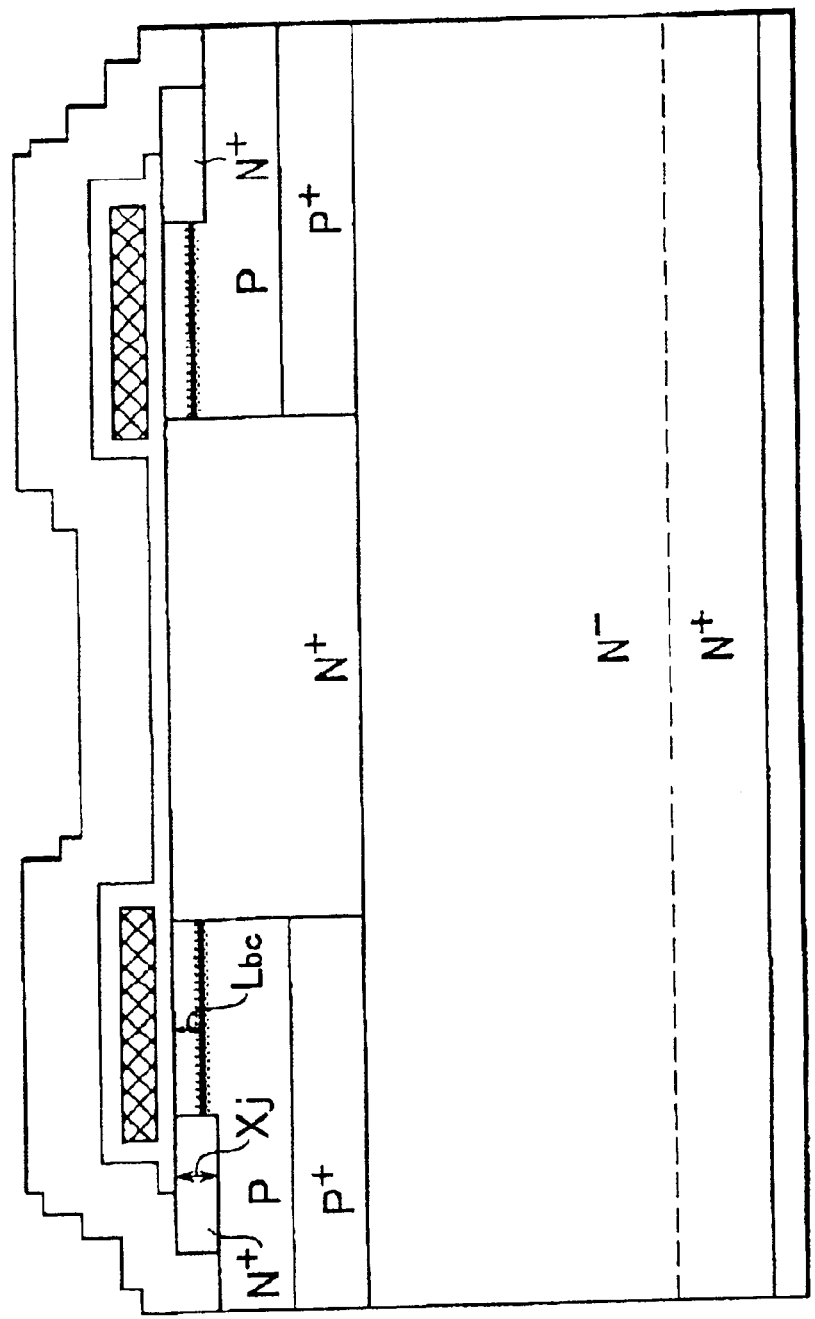

SIC SEMICONDUCTOR DEVICE

BACKGROUND OF THE INVENTION

1. Field of the Invention

The present invention relates to a SiC semiconductor device that is metal-insulator-semiconductor (MIS) field-effect transistor fabricated on a silicon carbide substrate. It particularly relates to a SiC semiconductor device having al optimized impurity diffusion layer and a defined substrate crystal plane orientation.

2. Description of the Prior Art

Silicon carbide has an energy gap that is two to three times larger than that of silicon and a breakdown voltage that is about three times higher. Silicon carbide is being viewed as the substrate material for the next generation of transistors for high-power, high-temperature and high-frequency applications. In particular, considerable expectations are being placed on metal-insulator-semiconductor field-effect transistors (MISFETs) for use as switching devices, since MISFETs are faster than bipolar transistors.

However, when a silicon carbide substrate is used, the interface between the oxide and the silicon carbide has an interface level density that is approximately one magnitude higher than that of a silicon MIS transistor. Thus, there is the problem that an MIS field-effect transistor that uses a silicon carbide substrate has a channel mobility that is approximately one magnitude lower than an MIS field-effect transistor that has a silicon substrate.

To make silicon MIS transistors less susceptible to the effect of the interface between the oxide layer and silicon carbide when electrons are flowing from the source to the drain, an MIS field-effect transistor having a buried channel region is known to exhibit excellent characteristics. However, in the case of an MIS transistor on a silicon carbide substrate, so far the optimization of buried channel region transistors has not been adequate, and have tended to operate as normally on (a state in which there is still a current flow between source and drain even when there is zero gate voltage), making the device difficult to use. Moreover, MIS transistors that are not normalized have poor hot-carrier endurance that results in inadequate punch-through endurance.

A number of inventions have been disclosed for improving the characteristics of buried channel MIS field-effect transistors. U.S. Pat. No. 5,864,157, for example, describes a double-gate flash memory that uses a P-type lower gate and an N-impurity in a buried channel region. However, since this only relates to a double-gate flash memory, it is different from the structure of the present invention. Moreover, the disclosure does not touch either on the concentration of the P-type polycrystalline silicon electrode and the impurity concentration of the buried channel region, or on the relationship of the depth of the source and drain regions and the depth of the channel region.

JP-A Hei 8-186179 describes an N-channel transistor having a lightly doped drain (LDD) structure with a P-gate and an N-doped buried channel region. However, the disclosure does not describe either the concentration of the P-type polycrystalline silicon electrode, or the relationship between the depths of the source and drain regions and the depth of the channel region. Similarly, JP-A Hei 7-131016 describes an MIS field-effect transistor characterized in that the channel formation face is parallel to the (11–20) surface of the hexagonal silicon carbide single-crystal substrate. However, the disclosure does not describe a buried channel region MIS field-effect transistor that uses a P-type gate.

An object of the present invention is to provide a SiC semiconductor device that is a buried channel region MIS transistor that is not put into a normally on state by optimization of the buried channel region type MIS transistor structure or silicon carbide No substrate crystal plane orientation, and has high hot-carrier endurance, high punch-through endurance and high channel mobility.

SUMMARY OF THE INVENTION

To attain the above object, the present invention provides a SiC semiconductor device comprising a semiconductor substrate having a P-type silicon carbide region, a gate insulation layer formed on the silicon carbide region, a P-type gate electrode formed on the gate insulation layer, an N-type impurity region having an impurity concentration sufficient to form a buried channel region in a semiconductor layer on a lower surface of the gate insulation layer, and source and drain regions comprised of N-type impurity regions formed adjacent to the gate insulation layer and gate electrode.

The invention also comprises the above device in which, in order to optimize the depth of the buried channel region and achieve high mobility, the ratio ($L_{bc}/X_j$) is not less than 0.2 and not more than 1.0, where the $L_{bc}$ is the depth from the interface between the gate insulation layer and the silicon carbide to the buried channel region, and the $X_j$ is the depth from the interface between the gate insulation layer and the silicon carbide to the source and drain region junction.

The invention also comprises the device described above in which the gate electrode is comprised of polycrystalline silicon in which boron or aluminum is diffused at a concentration within a range $1\times10^{16}$ cm$^{-3}$ to $1\times10^{21}$ cm$^{-3}$.

The invention also comprises the above device in which the buried channel region contains a diffusion of nitrogen, phosphorus, or arsenic at a maximum concentration that is from $5\times10^{15}$ cm$^{-3}$ to $1\times10^{18}$ cm$^{-3}$.

The invention also comprises the above device in which the gate includes a silicide layer of a refractory metal.

The invention also comprises the above device in which the refractory metal is tungsten, molybdenum or titanium.

The invention also comprises the above device in which, between the buried channel region and the source and drain regions, there is a region having an impurity concentration that is not lower than a maximum impurity concentration of the impurity layer region used to form the buried channel region and not higher than an impurity concentration of the source or drain regions.

The invention also comprises the above device in which there is included, between the buried channel region and the source and drain regions, a diffusion layer of nitrogen, phosphorus or arsenic at a maximum concentration that is from $5\times10^{16}$ cm$^{-3}$ to $5\times10^{19}$ cm$^{-3}$.

The invention also comprises the above device in which, located adjacently under the buried channel formation region is a P-type impurity diffusion region having an impurity concentration that is higher than an impurity concentration of the semiconductor substrate.

The invention also comprises the above device that has a high-concentration P-type impurity diffusion region located adjacently under the buried channel region that includes an aluminum or boron diffusion layer having a maximum impurity concentration of $1\times10^{17}$ cm$^{-3}$ to $1\times10^{19}$ cm$^{-3}$.

The invention also comprises the above device that is formed on a (11–20) surface of a hexagonal or rhombohedral or a (110) surface of a cubic system silicon carbide crystal in order to improve the channel mobility.

The invention also comprises the above device that has a lateral resurf or lateral DMOS type MOSFET structure.

The invention also comprises the above device that has a DMOS type MOSFET structure.

The invention also comprises the above device in which the gate electrode is formed of aluminum or an alloy that contains aluminum.

Further features of the invention, its nature and various advantages will be more apparent from the following detailed description which is to be read in conjunction with the accompanying drawings.

BRIEF DESCRIPTION OF THE DRAWINGS

FIG. 9 is a sectional view of another DMOS type MOSFET.

DESCRIPTION OF THE PREFERRED EMBODIMENTS

This invention is intended mainly for high-power transistors. There are various high-power transistors that use silicon substrates, and it is known that similar properties can be achieved using SiC substrates. The MOSFET shown in FIG. 6, which is referred to as a lateral resurf or lateral DMOS type MOSFET, is one such transistor. In the following, the structure and fabrication of this transistor are described.

EXAMPLE 1

Figure 1A:
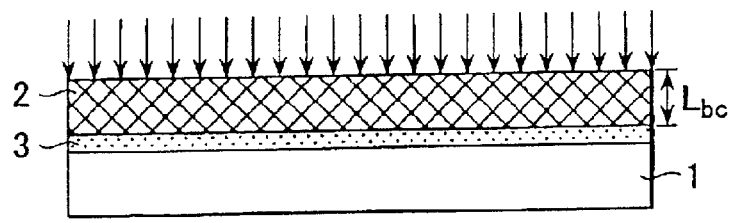
FIG. 1 depicts the steps of fabricating a MIS field-effect transistor having a P-type gate electrode and buried channel region.

FIG. 1(a) shows a P-type silicon carbide substrate 1 (4H—SiC, impurity concentration: $5 \times 10^{15}$ cm$^{-3}$). After the substrate 1 was subjected to RCA cleaning, reactive ion etching (RIE) was used to form photolithography alignment marks on the substrate. Next, in order to investigate the punch-through endurance improvement effect, aluminum ion implantation was used to form a punch-through prevention region 3 at a depth that placed the region below the buried channel region. At $1 \times 10^{16}$ cm$^{-3}$ to $1 \times 10^{19}$ cm$^{-3}$, the punch-through prevention region was given a higher aluminum concentration than that of the substrate 1. A number of samples were thus prepared.

The next step was to form the buried channel region 2, which was done using ion implantation of an N-type impurity such as nitrogen, phosphorus or arsenic. To use phosphorus to form a buried channel region at a junction depth ($L_{bc}$) of 0.3 $\mu$m, for example, the desired profile is formed using multiple implantations at 40 keV to 250 keV to provide a total dose to achieve a concentration of $7 \times 10^{15}$ cm$^{-3}$. To investigate the relationship between the channel mobility and the ratio between the depth ($X_j$) of the source 5 or drain 6 (FIG. 1(b)) and $L_{bc}$, buried channel regions 2 were formed at depths ($L_{bc}$) of 0.1, 0.2, 0.3, 0.4 and 0.5 $\mu$m. To investigate the concentration dependency of the buried channel region 2 with respect to channel mobility, ion implantation was used to prepare samples having concentrations ranging from $5 \times 10^{15}$ cm$^{-3}$ to $5 \times 10^{17}$ cm$^{-3}$ at an $L_{bc}$ of 0.3 $\mu$m.

Figure 1B:
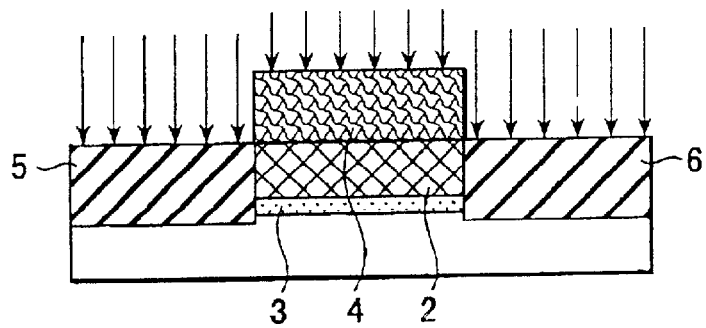

Subsequently, to form an ion implantation mask 4 for the source and drain regions shown in FIG. 1(b), thermal oxidation or chemical vapor deposition (CVD) was used to form a SiO$_2$ layer. As shown in FIG. 1(b), a low-temperature oxide (LTO) layer was used for the implantation mask. The LTO layer was formed by reacting silane and oxygen at 400° C. to 800° C. to form silicon dioxide, which was deposited on the substrate 1. Then, after using photolithography to form the source and drain regions, hydrofluoric acid was used to etch the LTO and open the source/drain regions. Next, to form the source 5 and drain 6, ion implantation at 500° C. was used to implant nitrogen, phosphorus or arsenic at a depth ($X_j$) of 0.5 $\mu$m. In this example, as in the case of the buried channel region 2, multiple implantation steps were used to form a phosphorus concentration of $5 \times 10^{19}$ cm$^{-3}$. This was followed by activation annealing for 30 minutes at 1500° C. in an argon atmosphere. This was followed by oxidation at 1200° C. for 150 minutes, forming a gate insulation layer 7 approximately 50 nm thick. After annealing for 30 minutes in an argon atmosphere, the samples were cooled in argon to room temperature.

Next came the forming of P-type gate electrode 8. Described below are a number of methods for this.

1) P-type polycrystalline silicon can be formed using the CVD method to form polycrystalline silicon, and then using boron or boron fluoride ion implantation.

2) The P-type polycrystalline silicon can be formed by using the CVD method to form polycrystalline silicon, followed by the formation of a boron-containing SiO$_2$ film by the CVD method or by spin-coating, and using heat-treatment at 800° C. to 1100° C. to effect diffusion.

3) The P-type polycrystalline silicon is formed by running silane and diborane together and heating them at 600° C., to grow the polycrystalline silicon while diffusing boron.

In this embodiment the method of 2) was used to form P-type polycrystalline silicon with an impurity concentration of $1 \times 10^{16}$ cm$^{-3}$ to $1 \times 10^{21}$ cm$^{-3}$ by adjusting the diffusion time at 900° C., and the relationship between the impurity concentration of the P-type gate electrode and channel mobility was investigated. To investigate the effect of the silicide film, using a number of samples, refractory metal silicide layers 9 of WSi$_2$, MoSi$_2$ and TiSi$_2$ were formed on the P-type polycrystalline silicon. The P-type polycrystalline silicon or composite silicide and P-type polycrystalline silicon layer and gate insulation layer were then etched to form the gate electrode. The oxide film over the source and drain regions was then etched to form contact holes. Following this, vapor deposition or sputtering was used to form a metal-containing layer or laminated layer of nickel, titanium or aluminum, and RIE or wet etching was used to form metal wires 10. In this example, vapor deposition of nickel was used, followed by wet etching. To ensure good ohmic contact, the samples were then heat-treated for 5 minutes at 1000° C. in an argon atmosphere, thereby completing the fabrication of MIS field-effect transistors.

Figure 2:
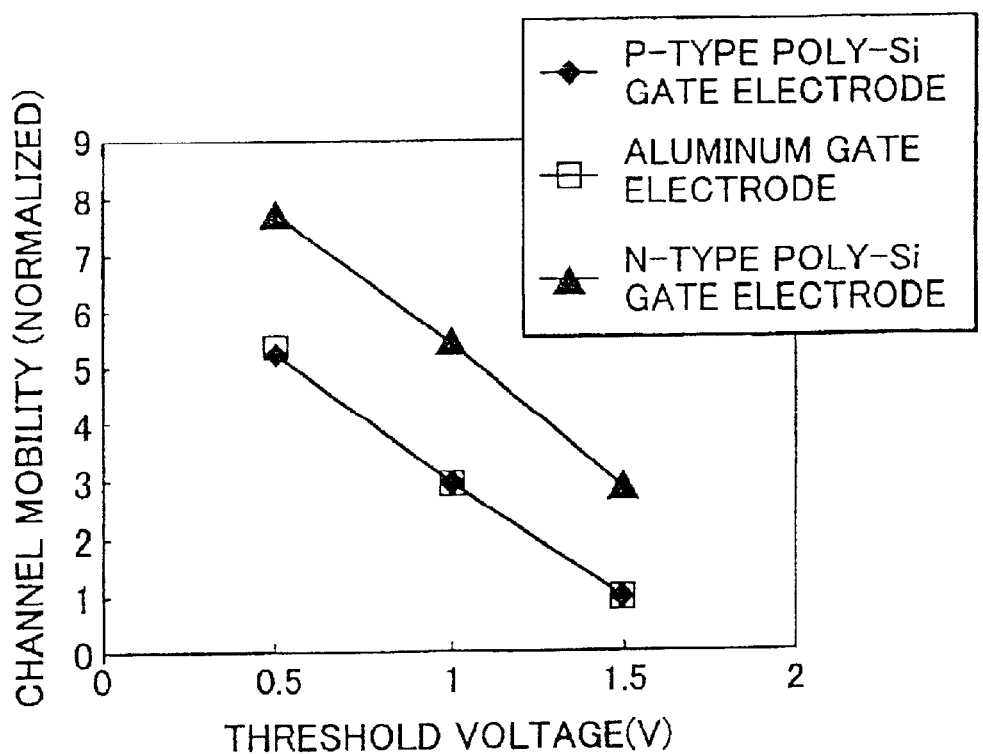
FIG. 2 is a measured result showing the relationship between channel mobility and threshold voltage in a MIS field-effect transistor with a gate electrode of P-type polycrystalline silicon, N-type polycrystalline silicon, and aluminum.

FIG. 2 shows the measurement-based relationship between channel mobility and threshold voltage in a MIS field-effect transistor with a gate electrode using P-type polycrystalline silicon, N-type polycrystalline silicon, and aluminum. At the same threshold voltage, channel mobility is higher with a gate electrode that uses N-type polycrystalline silicon or aluminum is used, compared to a gate electrode using P-type polycrystalline silicon. This might be attributable to the fact that, depending on the gate electrode polarity, a different amount of ion implantation is required to achieve the same threshold voltage. Implantation of N-type impurity into the buried channel region 2 results in the center of the channel being formed at a deep location, away from the interface between the gate insulation layer and the P-type silicon carbide substrate 1. Since this increases the number of carriers that are not readily susceptible to the effect of the high field near the interface channel mobility is increased. Channel mobility is also increased with increasing concentration of implanted N-type impurity. However, if the N-type impurity in the buried channel region 2 is increased to increase the channel mobility, the threshold voltage tends to decrease, becoming a negative voltage, creating a state in which current flows even at a zero voltage, that is, a normally on state that, in practice, makes it difficult to use the device. It is known that, in general, the larger the difference of work function between gate electrode and semiconductor, the higher the threshold voltage of the MIS field-effect transistor becomes. With reference to the difference of work function between gate electrode and semiconductor, it is also known that there is almost no change when aluminum is used for the gate electrode and the semiconductor is N-type polycrystalline silicon, but with P-type polycrystalline silicon, the difference becomes approximately one volt more. Therefore, even when N-type impurity is implanted in the channel region, the tendency for the threshold voltage to go negative and create a normally on state can be suppressed by using P-type polycrystalline silicon. Thus, even with the same threshold voltage, a higher impurity concentration is implanted in the buried channel region 2 to enable channel mobility to be increased.

Figure 3:
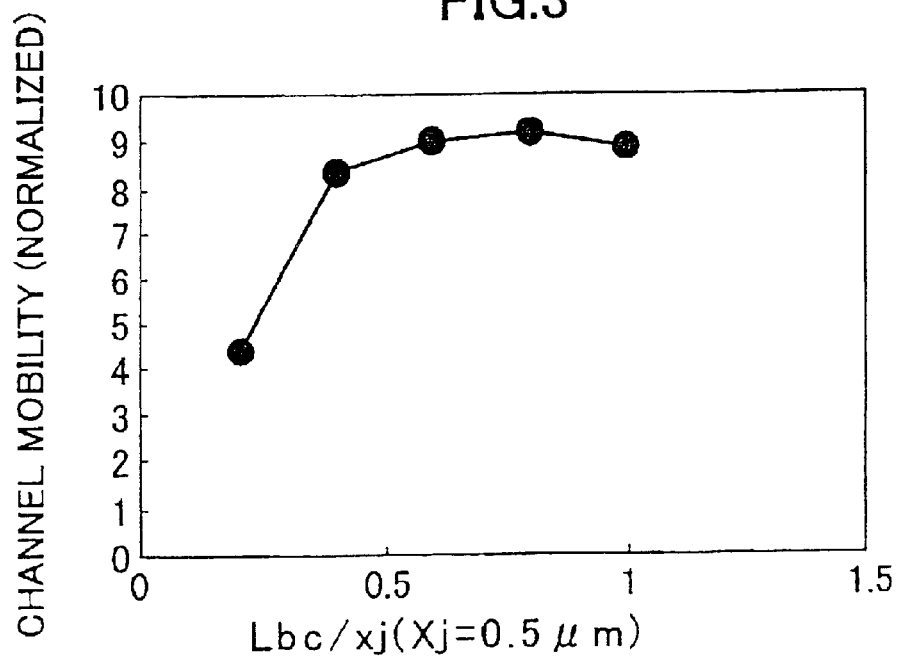
FIG. 3 is a measured result showing the $L_{bc}/X_j$ dependency of the channel mobility of the buried channel, with a P-type polycrystalline silicon gate electrode.

FIG. 3 is a measured result showing the $L_{bc}/X_j$ dependency of the channel mobility, when the junction depth $X_j$ of the source/drain diffusion layer is 0.5 μm. In FIG. 3, the vertical axis shows the normalized channel mobility of a sample having no buried channel region. The evaluation was performed using an $L_{bc}/X_j$ of 0.2 or above; it was confirmed that there was an effect even at 0.2. Therefore, the lower limit on the horizontal axis was set at 0.2. At over 1 on the horizontal axis, channel mobility increases, but the threshold voltage goes negative, resulting in a normally on state that makes the device difficult to use. Therefore, the horizontal axis is limited to 0.2 to 1.0. A range of 0.4 to 1.0 is particularly effective.

Figure 4:
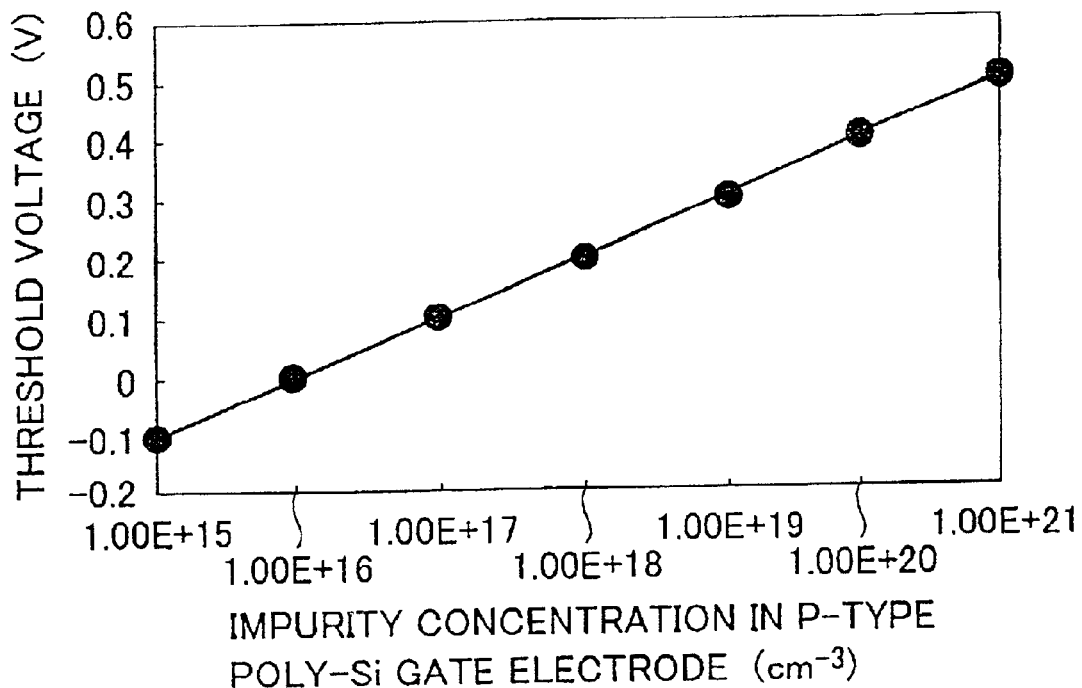
FIG. 4 is a measured result showing the relationship between the impurity concentration of the polycrystalline silicon gate and the threshold voltage.

FIG. 4 shows the measured relationship between the impurity concentration of the P-type polycrystalline silicon gate and the threshold voltage. A higher concentration increases the difference of work function between gate and semiconductor, increasing the threshold voltage. Conversely, a lower concentration decreases the threshold voltage, which at $1\times10^{16}$ cm$^{-3}$ becomes zero. Therefore the lower limit for the impurity concentration is set at $1\times10^{16}$ cm$^{-3}$ and the upper limit is set at $1\times10^{21}$ cm$^{-3}$.

Figure 5:
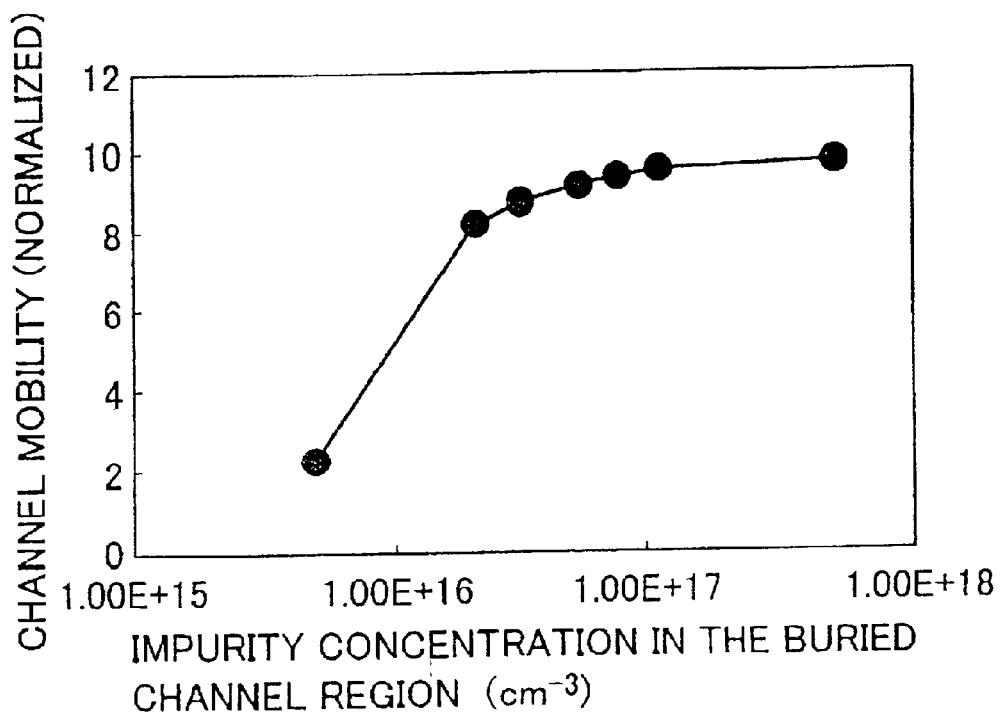
FIG. 5 is a measured result showing the relationship between channel mobility and the impurity concentration of the buried channel region.

FIG. 5 shows the measured relationship between channel mobility (using the value at an impurity concentration of zero as the standard value) and the impurity concentration of the buried channel region 2. The lower limit of the evaluation impurity concentration was $5\times10^{15}$ cm$^{-3}$. Since an adequate effect was achieved with that value, the lower limit was set at $5\times10^{16}$ cm$^{-3}$. With a concentration of $1\times10^{18}$ cm$^{-3}$ or over, the threshold voltage goes negative, making the device hard to use, so the upper limit was set at $1\times10^{18}$ cm$^{-3}$.

If the impurity concentration of the P$^+$ punch-through prevention region provided under the buried channel region 2 to suppress punch-through is lower than $1\times10^{17}$ cm$^{-3}$, the gate voltage that gives rise to punch-through is the same as when there is no P$^+$ region, meaning there is no effect. A concentration of at least $1\times10^{17}$ cm$^{-3}$ increases the gate voltage at which punch-through occurs, so the lower limit was set at $1\times10^{17}$ cm$^{-3}$. When the impurity concentration is $1\times10^{19}$ cm$^{-3}$ or higher, the impurity diffuses during activation annealing, offsetting the N-type impurity in the channel region above, making it impossible for the buried channel region to function as required. Therefore, the upper limit was set at $1\times10$ cm$^{-3}$.

The resistivity of polycrystalline silicon given a high boron concentration is in the order of several mΩcm, but the resistivity of the refractory metal silicides MOSi$_2$, WSi$_2$ and TiSi$_2$ are 60 Ωcm, 50 Ωcm and 15 Ωcm, respectively. So, the resistivity of a gate electrode that is a composite of polycrystalline silicon and silicide is lower compared to polycrystalline silicon in which impurity has been implanted. This makes it possible to reduce the resistance of wiring, using long, thin gate electrodes or the gate electrode formation layer. By using the wiring resistance to reduce the time constant, the operating speed of the device can be improved.

EXAMPLE 2

A P-type silicon carbide substrate 1 (impurity concentration: $5\times10^{15}$ cm$^{-3}$) shown in FIG. 1(*a*) was used. After the substrate 1 was subjected to RCA cleaning, reactive ion etching (RIE) was used to form photolithography alignment marks on the substrate. Next, phosphorus ion implantation was used to form a buried channel region 2 at a junction depth $L_{bc}$ of 0.3, using multiple implantations at 40 keV to 250 keV to provide a total dose for a concentration of $7\times10^{15}$ cm$^{-2}$. Then, as shown in FIG. 1(*d*), to form an ion implantation mask, an LTO layer was formed over the whole surface and photolithography was used to leave the gate electrode portion resist, with hydrofluoric acid being used to etch the LTO layer. To investigate the hot-carrier resistance effect of the impurity concentration between the buried channel region 2 and the source 5 and drain 6, ion implantation of phosphorus at 500° C. was used to form a low-impurity-concentration region 11 between the buried channel region 2 and the source 5 and drain 6 having an impurity concentration of $5\times10^{16}$ cm$^{-3}$ to $5\times10^{20}$ cm$^{-3}$. To form the source region 5 and drain region 6, an LTO layer was formed over the whole surface and photolithography used to form a photoresist to define the source and drain regions, and hydrofluoric acid was used to etch the LTO and expose the ion implantation source and drain regions. The source 5 and drain 6 were then formed using multiple ion implantations at 500° C. to form a phosphorus concentration of $5\times10^{19}$ cm$^{-3}$. This was followed by activation annealing for 30 minutes at 1500° C. in an argon atmosphere, and oxidation at 1200° C. for 150 minutes, forming the gate insulation layer 7 approximately 50 nm thick shown in FIG. 1(*c*). After annealing for 30 minutes in an argon atmosphere, the samples were cooled in argon to room temperature. The P-type gate electrode was then formed by using the CVD method to form polycrystalline silicon, using spin-coating to form a boron-containing oxide film or the polycrystalline silicon, followed by 30 minutes of heat treatment at 900° C. to diffuse boron from the boron-containing oxide film to the polycrystalline silicon. The P-type polycrystalline silicon and the gate insulation layer were etched to form the gate electrode. Next, LTO was deposited over the whole surface of the oxide layer and the oxide film over the source 5 and drain 6 was etched to form contact holes. The electron-beam evaporation method was then used to form a nickel over-layer and wet etching was used to form metal wires 10. To form a good ohmic contact, the samples were then heat-treated for 5 minutes at 1000° C. in an argon atmosphere, thereby completing the fabrication of MIS field-effect transistors.

The transistors were subjected to an electrical stress for a set time and the degree by which the threshold voltage changed was measured to evaluate hot carrier endurance. A smaller change in threshold voltage indicated good hot-carrier endurance. The threshold voltage was defined as the gate voltage that square root of drain current intersects the gate voltage axis, where the drain current was measured as a function of the gate voltage which was swept from 0 V to 30 V with a drain voltage of 0.1 V.

The electrical stress comprised applying 5 volts to the drain and 2.5 volts to the gate, for five minutes. Ion implantation of phosphorus was used to form an impurity concentration of $5 \times 10^{16}$ cm$^{-3}$ to $5 \times 10^{19}$ cm$^{-3}$ between the buried channel region 2 and the source/drain regions. A low impurity concentration in this region will result in a smaller field in the vicinity of the drain, making it possible to prevent electrons that pass through the region from entering a high-energy state, thereby improving hot-carrier endurance by decreasing the number of electrons that is injected into the gate insulation layer from the substrate. However, if the impurity concentration of this region is too low, the resistance of the region will become too high, reducing the driving force of the transistor. Therefore, the lower limit is set at $5 \times 10^{16}$ cm$^{-3}$. If the concentration is too high, the field in the vicinity of the drain will not be alleviated, making it impossible to attain sufficient hot-carrier endurance. From measurements, it was found that with a concentration of $5 \times 10^{19}$ cm$^{-3}$ or higher, the change in threshold voltage exceeded 10%, an amount that makes the device unusable. Therefore, the upper limit was set at $5 \times 10^{19}$ cm$^{-3}$.

EXAMPLE 3

Figure 1C:
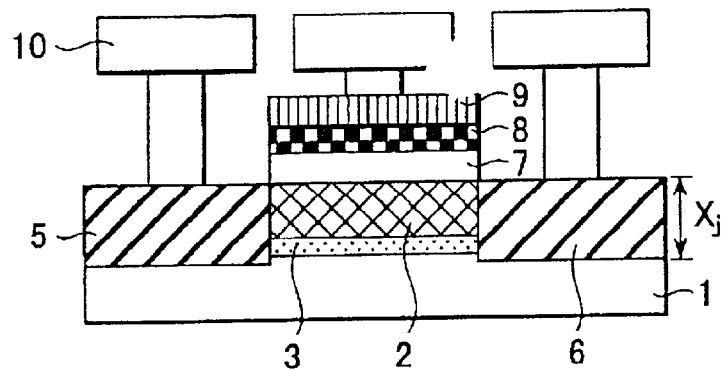
Figure 1D:
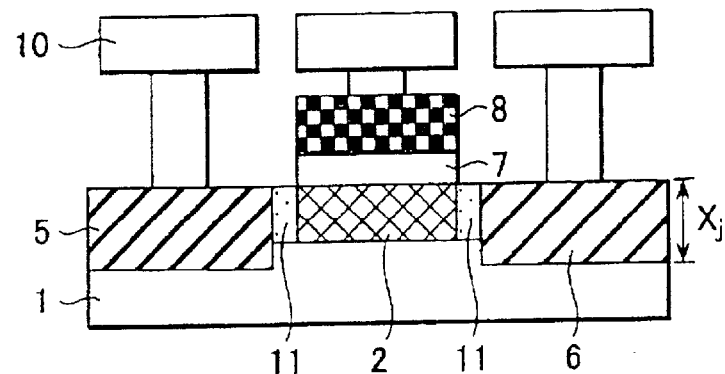

P-type silicon carbide substrates 1 with hexagonal silicon carbide crystalline (0001) and (11–20) surfaces (impurity concentration: $5 \times 10^{15}$ cm$^{-3}$) were subjected to RCA cleaning, and reactive ion etching (RIE) was used to form photolithography alignment marks on the substrates. Phosphorus ion implantation was then used to form a buried channel region 2 at a junction depth $L_{bc}$ of 0.3, using multiple implantations at 40 keV to 250 keV to provide a total dose for a concentration of $7 \times 10^{15}$ cm$^{-2}$. Next, to form an ion implantation mask 4 for the source and drain regions shown in FIG. 1(b), thermal oxidation or chemical vapor deposition (CVD) was used to forma SiO$_2$ layer. As shown in FIG. 1(b), a low-temperature oxide (LTO) layer was used for the implantation mask. The LTO layer was formed by reacting silane and oxygen at 400° C. to 800° C. to form silicon dioxide, which was deposited on the substrate 1. A photoresist was then used to define the source and drain regions, and hydrofluoric acid was used to etch the LTO to form an opening to the source/drain regions that are to be subjected to the ion implantation. The source 5 and drain 6 of FIG. 1(b) were then formed using phosphorus ion implantation steps effected at 500° C. to achieve an impurity concentration of $5 \times 10^{19}$ cm$^3$. This was followed by activation annealing for 30 minutes at 1500° C. in an argon atmosphere. This was followed by oxidation at 1200° C. for 150 minutes, forming the approximately 50 nm gate insulation layer 7, as shown in FIG. 1(c). After annealing for 30 minutes in an argon atmosphere, the samples were cooled in argon to room temperature. The P-type gate electrode 8 was then formed using the CVD method to form polycrystalline silicon and using spin-coating to form a boron-containing oxide film on the polycrystalline silicon, followed by 30 minutes of heat treatment at 900° C. to diffuse boron from the boron-containing oxide film to the polycrystalline silicon. The P-type polycrystalline silicon and the gate insulation layer were then etched to form the gate electrode. The oxide film over the source and drain regions was then etched to form contact holes. The electron-beam evaporation method was then used to form a nickel over-layer and wet etching was used to form metal wires 10. To form a good ohmic contact, the samples were then heat-treated for 5 minutes at 1000° C. in an argon atmosphere, thereby completing the fabrication of the MIS field-effect transistors.

The MIS field-effect transistors thus fabricated on a (0001) surface had a channel mobility of 70 cm$^2$/Vs, while MIS field-effect transistors fabricated on a (11–20) surface had a channel mobility of 100 cm$^2$/Vs. Thus, the channel mobility was improved by fabricating NHS field-effect transistors on a (11–20) surface.

Figure 6:
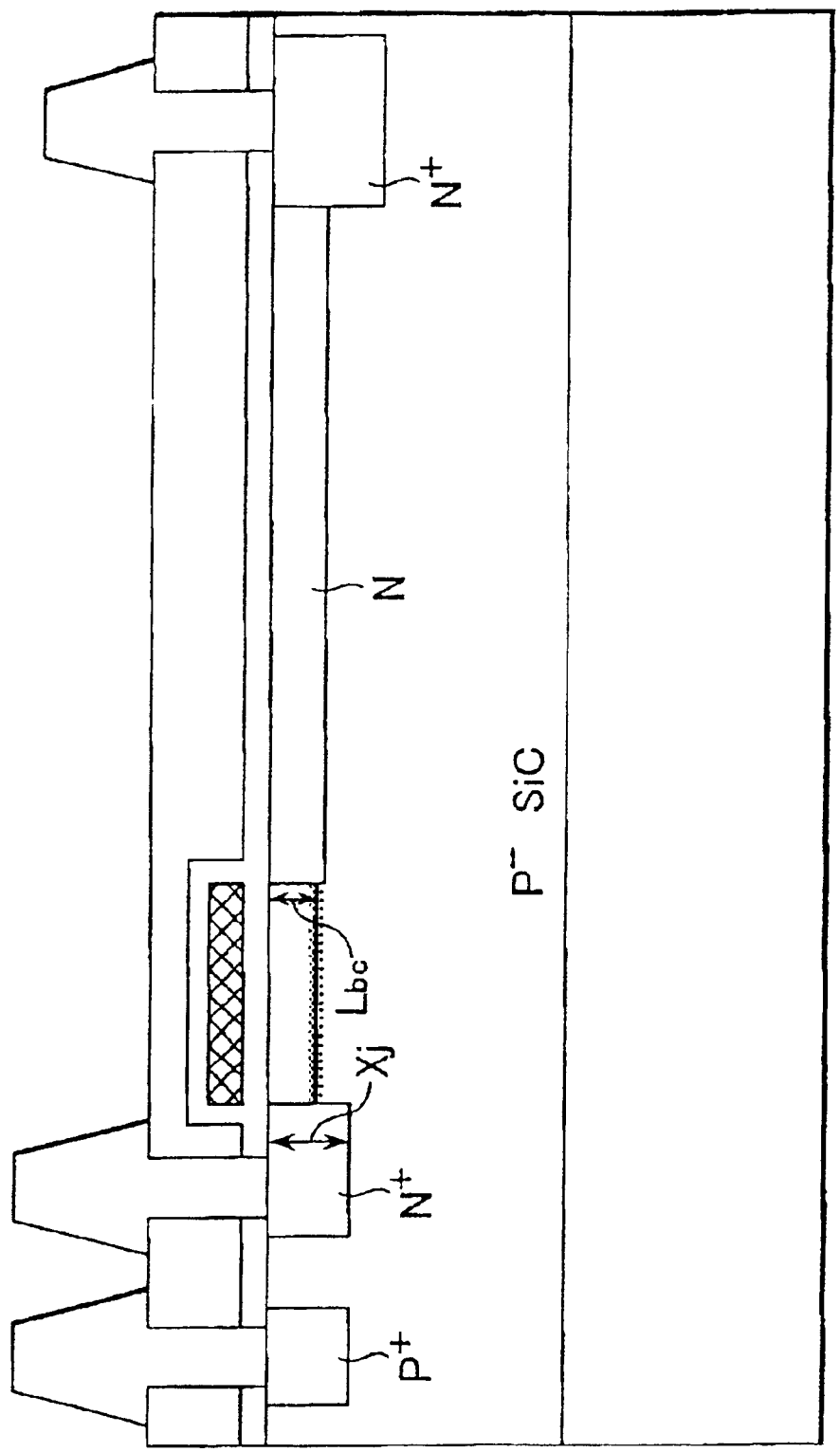
FIG. 6 is a sectional view of a lateral resurf or lateral DMOS type MOSFET.
Figure 7:
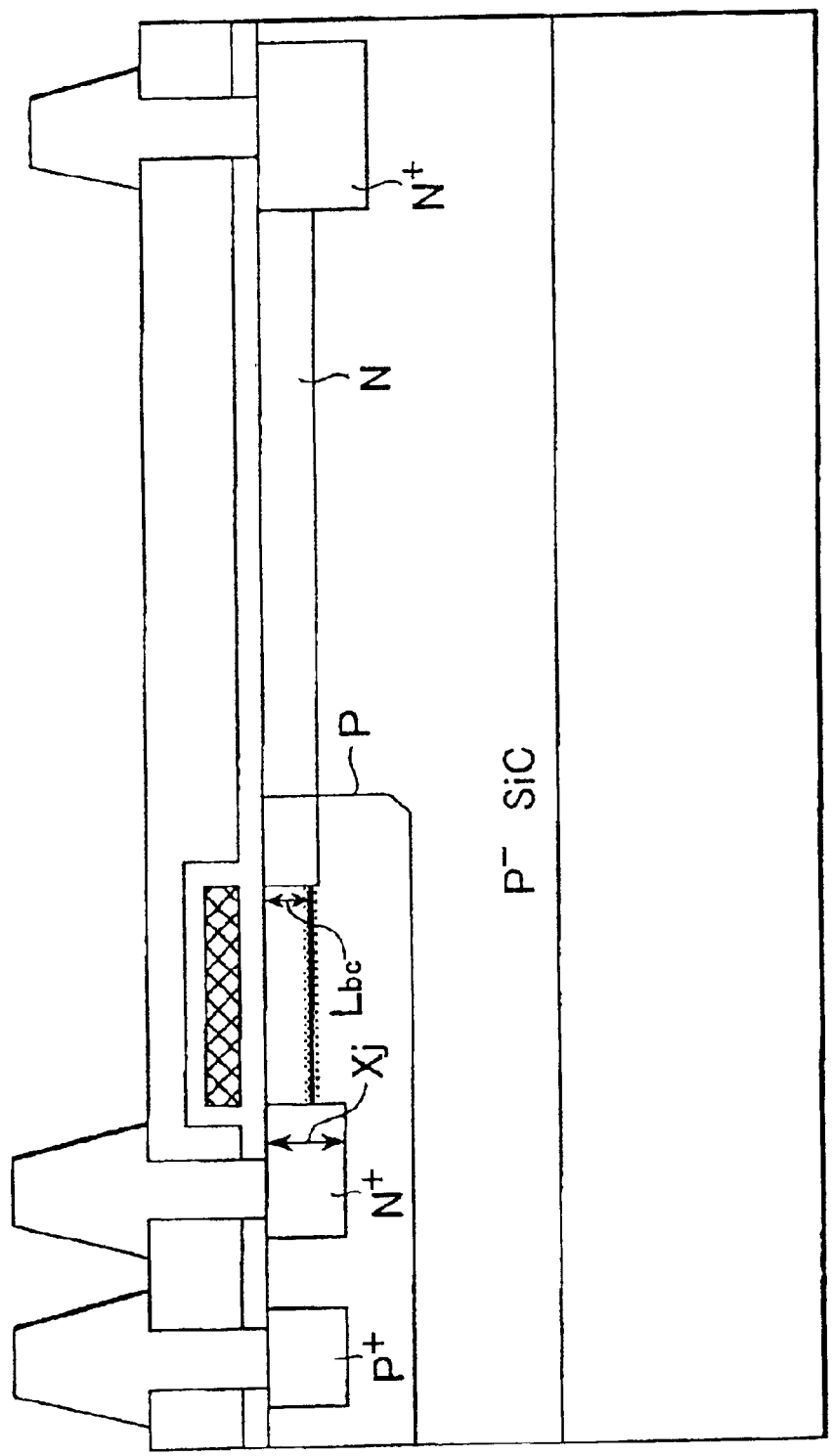
FIG. 7 is a sectional view of a lateral resurf or lateral DMOS type MOSFET with a well.

FIG. 6 shows an example of a type of MOSFET structure referred to as a lateral resurf or lateral DMOS type structure. Ion implantation can also be used to form a lateral resurf or lateral DMOS type MOSFET with a P-well, as shown in FIG. 7. The P-well is formed as follows. The surface of a P-type epitaxially grown SIC substrate layer is subjected to multiple boron ion implantation steps at 30 to 160 keV, using dosages ranging from 1.5 to $36 \times 10^{13}$ cm$^2$, which is followed by 30 minutes of annealing at 1600° C., thereby forming the P-well. The P-well can also be formed using aluminum. The remaining process steps are the same as those described with respect to the preceding examples.

The above-described transistor structure can also be applied to the DMOS type MOSFET shown in FIG. 8, by making the slight modifications described below. The modifications relate to the substrate and well formation, and require the following additional processes. First, a SiC layer is epitaxially grown on an N$^+$ substrate, over the drain, and another N$^+$ layer is formed on the first N$^+$ layer, and the surface thereof is subjected to multiple boron ion implantation steps at 30 to 160 keV, using dosages ranging from 1.5 to $36 \times 10^{13}$ cm$^{-2}$ which is followed by 30 minutes of annealing at 1600° C., thereby forming the P-well. The P-well can also be formed using aluminum. The remaining process steps are the same as those described with respect to the preceding examples.

Figure 8:
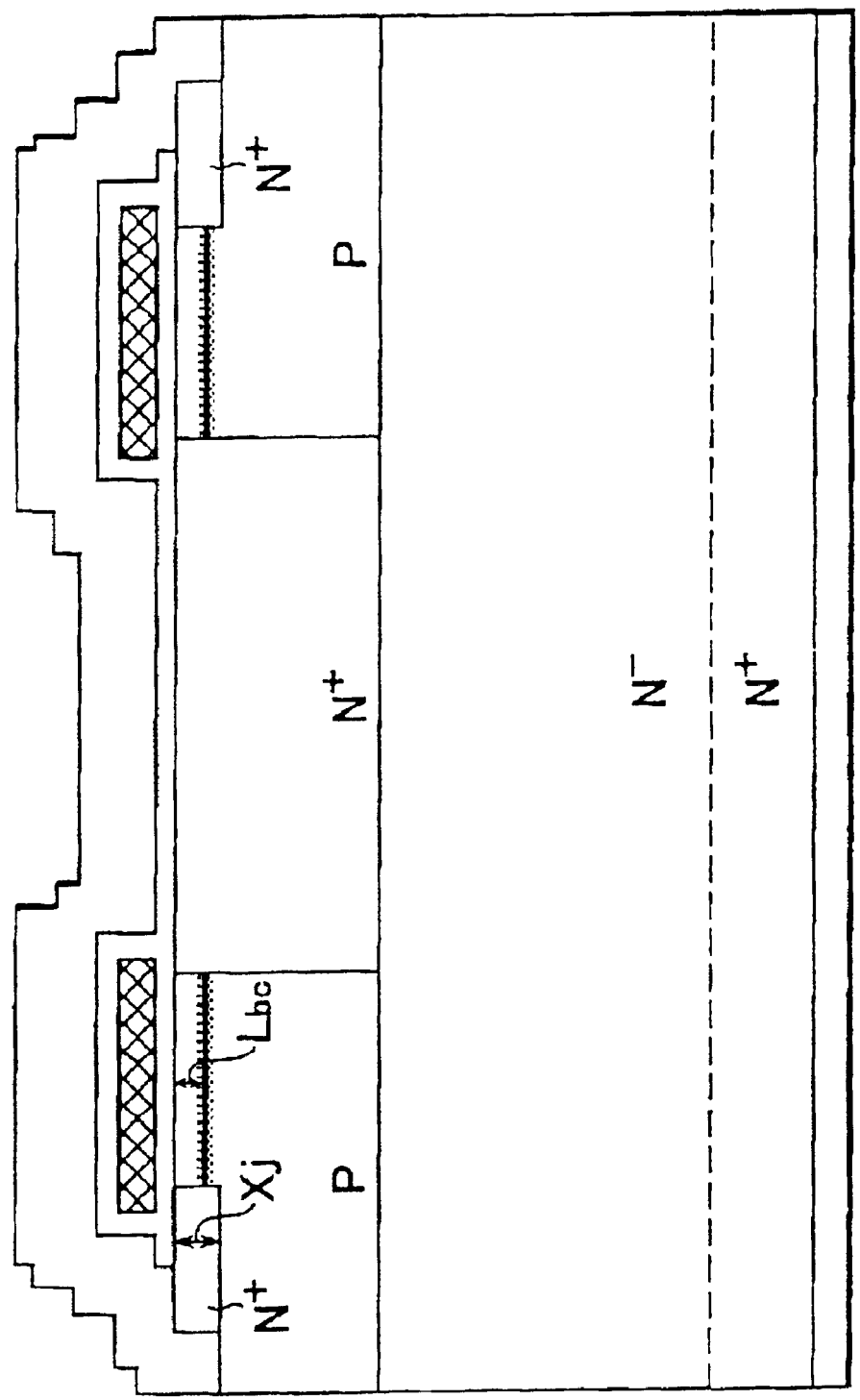
FIG. 8 is a sectional view of a DMOS type MOSFET.

The DMOS type MOSFET shown in FIG. 9 also can be obtained by adding a step of implanting boron ions at 200 to 400 keV using dosages ranging from 3.0 to $10 \times 10^{13}$ cm$^{-2}$ to the steps of the DMOS type MOSFET shown in FIG. 8.

While in the foregoing description the material of the semiconductor region is silicon carbide, the invention is not limited thereto, with the same effect being obtained with a substrate having a semiconductor region of diamond, silicon, gallium nitride or other such semiconductor material. Additionally, a semiconductor device having a (000–1) surface may be used.

The invention comprised as described in the foregoing provides the following effects.

Using a P-type gate electrode makes it possible to use a relatively high N⁻ concentration without the device assuming a normally on state, thereby making it possible to increase channel mobility. Channel mobility is also improved when optimizing the ratio between the source/drain junction depth $L_{bc}$ and the junction depth of the buried channel region junction. The channel mobility can also be improved by the optimization of the P-type polycrystalline silicon concentration, and the concentration of the buried channel region.

Device driving power can be raised when reducing the gate resistance by forming a refractory metal silicide layer over the P-type polycrystalline silicon gate electrode. The operating speed of the SiC semiconductor device can be increased using tungsten, molybdenum or titanium silicide layers. Hot-carrier endurance can be improved by the provision, between the buried channel formation region and the source and drain regions, a region having an impurity concentration that is not lower than the maximum impurity concentration of the impurity diffusion layer region used to form the buried channel region, and not higher than the impurity concentration of the source and drain regions.

Punch-through endurance is improved by providing the P-type silicon carbide substrate 1 with a concentrated impurity region that is located beneath the buried channel region, and by optimizing the concentration of the region. Channel mobility is also improved by fabricating the device on the (11–20) surface of a hexagons! or rhombohedral or a (110) surface of a cubic system silicon carbide crystal. A high-power transistor can be readily realized by forming the device as a transistor having a lateral resurf or lateral DMOS type MOSFET structure. Also, the device can be readily fabricated as a normally off transistor by using aluminum or an aluminum alloy for the gate electrode.

What is claimed is:

1. A SiC semiconductor device comprising:
   a semiconductor substrate having a (11–20), (000–1) or (0001) surface of a hexagonal or rhombohedral system P-type silicon carbide region, or a (110) surface of a cubic system P-type silicon carbide region;
   a gate insulation layer formed on the silicon carbide region;
   an effective P-type gate electrode formed on the gate insulation layer;
   an N-type impurity region having an impurity concentration sufficient to form a buried channel region in a semiconductor layer on a lower surface of the gate insulation layer;
   a diffusion region formed in the semiconductor substrate; and
   source and drain regions comprised of N-type impurity regions formed adjacent to the gate insulation layer and gate electrode,
   wherein a ratio ($L_{bc}/X_j$) is not less than 0.2 and not more than 1.0 for the (000–1) or (110) surface and is not less than 0.2 and not more than 0.5 for the (11–20) or (0001) surface, where the $L_{bc}$ is a depth of the buried channel region adjacent to a boundary formed by the N-type impurity region and the P-type silicon carbide region, and the $X_j$ is a depth of the source and drain regions.

2. A device according to claim 1, wherein the gate electrode is comprised of polycrystalline silicon in which boron or aluminum is diffused at a concentration within a range of from $1\times10^{16}$ cm⁻³ to $1\times10^{21}$ cm³.

3. A device according to claim 1, wherein the gate electrode includes a silicide layer of a refractory metal.

4. A device according to claim 3, wherein the refractory metal is tungsten, molybdenum or titanium.

5. A device according to claim 1, wherein the gate electrode is formed of aluminum or an alloy that contains aluminum.

6. A device according to claim 5, having a lateral resurf or lateral DMOS type MOSFET structure.

7. A device according to claim 1, wherein the buried channel region contains a diffusion of nitrogen, phosphorus or arsenic at a maximum concentration that is from $5\times10^{15}$ cm⁻³ to $1\times10^{18}$ cm⁻³.

8. A device according to claim 7, wherein the diffusion region has an impurity concentration that is not lower than a maximum impurity concentration of the impurity region used to form the buried channel region and not higher than an impurity concentration of the source or drain regions.

9. A device according to claim 8, wherein the diffusion region comprises nitrogen, phosphorus, or arsenic at a maximum concentration that is from $5\times10^{16}$ cm⁻³ to $1\times10^{19}$ cm⁻³.

10. A device according to claim 9, wherein the diffusion region is a P-type impurity diffusion region having an impurity concentration that is higher than an impurity concentration of the semiconductor substrate, said P-type impurity diffusion region being located adjacently under the buried channel formation region.

11. A device according to claim 10, wherein the diffusion region is a high-concentration P-type impurity diffusion region located adjacently under the buried channel region that includes an aluminum or boron diffusion region having a maximum impurity concentration of $1\times10^{17}$ cm⁻³ to $1\times10^{19}$ cm⁻³.

12. A device according to claim 11, having a lateral resurf or lateral DMOS type MOSFET structure.

13. A device according to claim 10, having a DMOS type MOSFET structure.

14. A device according to claim 8, having a lateral resurf or lateral DMOS type MOSFET structure.

15. A device according to claim 8, having a DMOS type MOSFET structure.

16. A device according to claim 7, wherein the diffusion region is a P-type impurity diffusion region having an impurity concentration that is higher than an impurity concentration of the semiconductor substrate, said P-type impurity diffusion region being located adjacently under the buried channel region.

17. A device according to claim 16, having a lateral resurf or lateral DMOS type MOSFET structure.

18. A device according to claim 16, having a DMOS type MOSFET structure.

19. A device according to claim 7, having a lateral resurf or lateral DMOS type MOSFET structure.

20. A device according to claim 19, wherein at least one of the source and drain is formed of nickel or an alloy containing nickel.

21. A device according to claim 1, wherein the diffusion region has an impurity concentration that is not lower than a maximum impurity concentration of the impurity region used to form the buried channel region and not higher than an impurity concentration of the source or drain regions.

22. A device according to claim 21, wherein the diffusion region comprises nitrogen, phosphorus, or arsenic at a maximum concentration that is from $5\times10^{16}$ cm⁻³ to $1\times10^{19}$ cm⁻³.

23. A device according to claim 22, wherein the diffusion region is a P-type impurity diffusion region having an impurity concentration that is higher than an impurity concentration of the semiconductor substrate, said P-type impurity diffusion region being located adjacently under the buried channel region.

24. A device according to claim 23, wherein the diffusion region is a high-concentration P-type impurity diffusion region located adjacently under the buried channel region that includes an aluminum or boron diffusion region having a maximum impurity concentration of $1\times10^{17}$ cm$^{-3}$ to $1\times10^{19}$ cm$^{-3}$.

25. A device according to claim 24, having a lateral resurf or lateral DMOS type MOSFET structure.

26. A device according to claim 23, having a DMOS type MOSFET structure.

27. A device according to claim 24, wherein at least one of the source and drain is formed of nickel or an alloy containing nickel.

28. A device according to claim 21, having a lateral resurf or lateral DMOS type MOSFET structure.

29. A device according to claim 21, having a DMOS type MOSFET Structure.

30. A device according to claim 1, having a lateral resurf or lateral DMOS type MOSFET structure.

31. A device according to claim 30, wherein at least one of the source and drain is formed of metal or an alloy containing nickel.

32. A device according to claim 1, having a DMOS type MOSFET structure.

33. A device according to claim 32, wherein at least one of the source and drain is formed of nickel or an alloy containing nickel.

34. A device according to claim 1, further comprising metal wires formed on at least one of the source region, the drain region, and the gate electrode, wherein the metal wires comprise nickel.

* * * * *

UNITED STATES PATENT AND TRADEMARK OFFICE
CERTIFICATE OF CORRECTION

PATENT NO. : 6,759,684 B2 Page 1 of 1
APPLICATION NO. : 09/987271
DATED : July 6, 2004
INVENTOR(S) : Kenji Fukuda et al.

It is certified that error appears in the above-identified patent and that said Letters Patent is hereby corrected as shown below:

On The Title Page; Item (54)
The title of the invention should read as follows: SIC SEMICO<u>N</u>DUCTOR DEVICE.

Signed and Sealed this

Twenty-ninth Day of May, 2007

JON W. DUDAS
*Director of the United States Patent and Trademark Office*